United States Patent
Lee et al.

(10) Patent No.: US 11,121,309 B2
(45) Date of Patent: Sep. 14, 2021

(54) MAGNETIC MEMORY DEVICES INCLUDING MAGNETIC TUNNEL JUNCTIONS

(71) Applicant: Samsung Electronics Co., Ltd., Suwon-si (KR)

(72) Inventors: Sung Chul Lee, Osan-si (KR); Kwang Seok Kim, Seoul (KR); Jangeun Lee, Suwon-si (KR); Ung Hwan Pi, Hwaseong-si (KR)

(73) Assignee: Samsung Electronics Co., Ltd.

( * ) Notice: Subject to any disclaimer, the term of this patent is extended or adjusted under 35 U.S.C. 154(b) by 0 days.

(21) Appl. No.: 16/901,866

(22) Filed: Jun. 15, 2020

(65) Prior Publication Data

US 2021/0104661 A1    Apr. 8, 2021

(30) Foreign Application Priority Data

Oct. 2, 2019 (KR) ........................ 10-2019-0122494

(51) Int. Cl.
| | |
|---|---|
| H01L 43/02 | (2006.01) |
| G11C 11/16 | (2006.01) |
| H01L 43/10 | (2006.01) |
| H01L 43/12 | (2006.01) |
| H01L 43/08 | (2006.01) |

(52) U.S. Cl.
CPC ............ *H01L 43/02* (2013.01); *G11C 11/161* (2013.01); *H01L 43/08* (2013.01); *H01L 43/10* (2013.01); *H01L 43/12* (2013.01)

(58) Field of Classification Search
None
See application file for complete search history.

(56) References Cited

U.S. PATENT DOCUMENTS

| | | |
|---|---|---|
| 8,558,331 B2 | 10/2013 | Zhu et al. |
| 8,686,484 B2 | 4/2014 | Whig et al. |
| 9,705,072 B2 | 7/2017 | Li et al. |
| 9,741,926 B1 | 8/2017 | Pinarbasi et al. |
| 9,898,426 B2 | 2/2018 | Lee |
| 9,929,211 B2 | 3/2018 | Zhu et al. |

(Continued)

FOREIGN PATENT DOCUMENTS

KR    1020180022870    3/2018

OTHER PUBLICATIONS

Seo et al. "Current-induced synchronized switching of magnetization" Applied Physics Letters, 101(6):062408 (2012).

*Primary Examiner* — Tan T. Nguyen
(74) *Attorney, Agent, or Firm* — Myers Bigel, P.A.

(57) ABSTRACT

A magnetic memory device may include a perpendicular magnetic structure, an in-plane magnetic structure, a free magnetic pattern between the perpendicular magnetic structure and the in-plane magnetic structure, and a tunnel barrier pattern between the perpendicular magnetic structure and the free magnetic pattern. The perpendicular magnetic structure may include at least one pinned pattern which has a perpendicular magnetization direction that is pinned to a specific direction, and the free magnetic pattern may have a switchable perpendicular magnetization direction. The in-plane magnetic structure may include a first magnetic pattern and a second magnetic pattern, and each of the first and second magnetic patterns may have a different respective in-plane magnetization direction.

20 Claims, 9 Drawing Sheets

(56) References Cited

U.S. PATENT DOCUMENTS

| | | |
|---|---|---|
| 9,953,692 B1 | 4/2018 | Mihajlovic et al. |
| 10,127,956 B2 | 11/2018 | Lee et al. |
| 10,134,808 B2 | 11/2018 | Kan et al. |
| 10,158,065 B2 | 12/2018 | Doyle et al. |
| 10,193,059 B2 | 1/2019 | Lee et al. |
| 2014/0159175 A1 | 6/2014 | Lee et al. |
| 2017/0155040 A1* | 6/2017 | Noh .................. G06F 12/0831 |
| 2019/0013461 A1 | 1/2019 | Wang et al. |
| 2019/0287591 A1* | 9/2019 | Perrissin-Fabert ........................ H01F 10/3295 |

* cited by examiner

MAGNETIC MEMORY DEVICES INCLUDING MAGNETIC TUNNEL JUNCTIONS

CROSS-REFERENCE TO RELATED APPLICATIONS

This U.S. non-provisional patent application claims priority under 35 U.S.C. § 119 to Korean Patent Application No. 10-2019-0122494, filed on Oct. 2, 2019, in the Korean Intellectual Property Office, the entire contents of which are hereby incorporated by reference.

TECHNICAL FIELD

The present disclosure relates to semiconductor devices, and in particular, to magnetic memory devices including magnetic tunnel junctions.

BACKGROUND

As electronic devices with high speed and/or low power consumption properties are becoming increasingly desired for various applications, there is a corresponding increasing demand for semiconductor memory devices with faster operating speeds and/or lower operating voltages. Magnetic memory devices have been proposed to satisfy such a demand. For example, magnetic memory devices can provide technical advantages, such as high speed and/or non-volatility, and thus, magnetic memory devices are emerging as a potential next-generation memory device.

In general, a magnetic memory device includes a magnetic tunnel junction (MTJ). The MTJ includes two magnetic layers and an insulating layer interposed therebetween. A resistance of the MTJ varies depending on magnetization directions of the magnetic layers. For example, the resistance of the MTJ is higher when magnetization directions of the magnetic layers are anti-parallel to each other than when they are parallel to each other. Such a difference in resistance can be used for data storing operations of the magnetic memory device.

However, more research is still needed to realize magnetic memory devices with improved thermal stability and reduced writing current, including where magnetic memory devices are being reduced in size or scaled down.

SUMMARY

Aspects of the present disclosure provide magnetic memory devices having an improved thermal stability property and a reduced switching current property.

According to some embodiments of the inventive concepts, a magnetic memory device may include a perpendicular magnetic structure, an in-plane magnetic structure, a free magnetic pattern between the perpendicular magnetic structure and the in-plane magnetic structure, and a tunnel barrier pattern between the perpendicular magnetic structure and the free magnetic pattern. The perpendicular magnetic structure may include at least one pinned pattern which has a perpendicular magnetization direction that is pinned to a specific direction, and the free magnetic pattern may have a switchable perpendicular magnetization direction. The in-plane magnetic structure may include a first magnetic pattern and a second magnetic pattern, and each of the first and second magnetic patterns may have different respective in-plane magnetization directions.

According to some embodiments of the inventive concepts, a magnetic memory device may include a perpendicular magnetic structure, an in-plane magnetic structure, a free magnetic pattern between the perpendicular magnetic structure and the in-plane magnetic structure, and a tunnel barrier pattern between the perpendicular magnetic structure and the free magnetic pattern. The perpendicular magnetic structure may include at least one pinned pattern having a perpendicular magnetization direction pinned to a specific direction, and the free magnetic pattern may have a magnetization direction, switchable between parallel and anti-parallel to the perpendicular magnetization direction of the at least one pinned pattern. The in-plane magnetic structure may include a first magnetic pattern, a second magnetic pattern, and a first non-magnetic pattern therebetween. A magnetization direction of each of the first and second magnetic patterns may be perpendicular to the magnetization direction of the free magnetic pattern, and the first and second magnetic patterns may be antiferromagnetically coupled to each other by the first non-magnetic pattern.

According to some embodiments of the inventive concepts, a magnetic memory device may include an interconnection structure on a substrate, the interconnection structure including interconnection lines, which are spaced apart from each other in a first direction perpendicular to a top surface of the substrate, and contacts, which are between the interconnection lines, a lower contact plug on the interconnection structure and connected to a topmost one of the interconnection lines, a magnetic tunnel junction pattern on the lower contact plug, a bottom electrode between the lower contact plug and the magnetic tunnel junction pattern, a top electrode on the magnetic tunnel junction pattern, an in-plane magnetic structure between the magnetic tunnel junction pattern and the top electrode, and a spacer between the magnetic tunnel junction pattern and the in-plane magnetic structure The in-plane magnetic structure may include a first magnetic pattern, a second magnetic pattern on the first magnetic pattern, and a non-magnetic pattern between the first and second magnetic patterns. The first and second magnetic patterns may include at least one of nickel, iron, or cobalt. A thickness of each of the first and second magnetic patterns may be greater than or equal to 0.5 nm and may be smaller than 10 nm, and a thickness of the first magnetic pattern may be smaller than a thickness of the second magnetic pattern. An magnetocrystalline anisotropy energy of each of the first and second magnetic patterns may be greater than 0 erg/cm$^3$ and may be smaller than $1\times10^7$ erg/cm$^3$.

BRIEF DESCRIPTION OF THE DRAWINGS

The present disclosure will be more clearly understood from the following description of example embodiments of the inventive concepts presented herein, taken in conjunction with the accompanying drawings. The accompanying drawings represent non-limiting, example embodiments as described herein.

DETAILED DESCRIPTION

A semiconductor package according to the present inventive concepts will be described herein with reference to accompanying drawings.

Figure 1A:
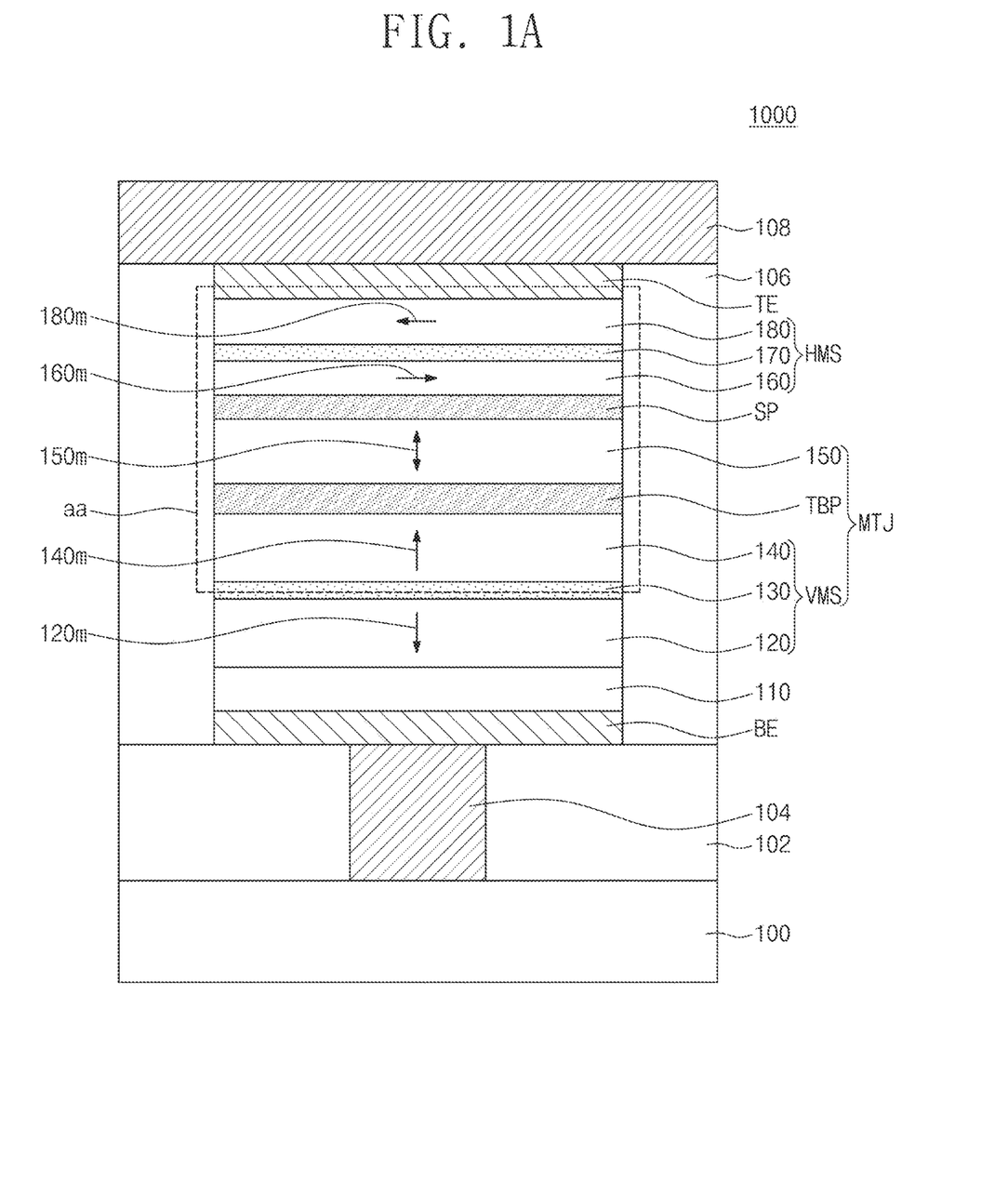
FIG. 1A is a sectional view illustrating a magnetic memory device according to some embodiments of the inventive concepts.
Figure 1B:
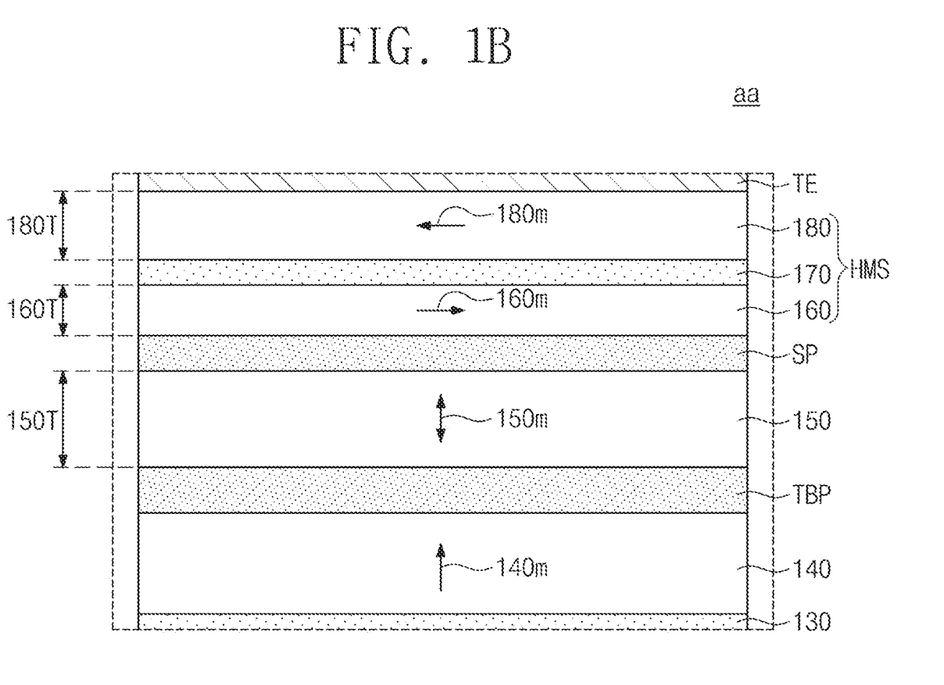
FIG. 1B is an enlarged view of a portion 'aa' of FIG. 1A.

FIG. 1A is a sectional view illustrating a magnetic memory device according to some embodiments of the inventive concepts. FIG. 1B is an enlarged view illustrating a portion 'aa' of FIG. 1A.

Referring to FIGS. 1A and 1B, a lower interlayered insulating layer 102 may be on a substrate 100. The substrate 100 may be a semiconductor substrate, such as silicon (Si), silicon-on-insulator (SOI), silicon germanium (SiGe), germanium (Ge), and gallium arsenide (GaAs) wafers. Selection elements (not shown) may be provided on the substrate 100, and the lower interlayered insulating layer 102 may cover the selection elements (not shown). The selection elements may be field effect transistors or diodes. The lower interlayered insulating layer 102 may be formed of or include at least one of an oxide, a nitride, and/or an oxynitride.

A lower contact plug 104 may be arranged in the lower interlayered insulating layer 102. The lower contact plug 104 may be formed to penetrate the lower interlayered insulating layer 102 and may be electrically coupled to a terminal of a corresponding one of the selection elements. The lower contact plug 104 may include at least one of doped semiconductor materials (e.g., doped silicon), metals (e.g., tungsten, titanium, and/or tantalum), conductive metal nitrides (e.g., titanium nitride, tantalum nitride, and/or tungsten nitride), or metal-semiconductor compounds (e.g., metal silicide).

A bottom electrode BE may be on the lower interlayered insulating layer 102. The bottom electrode BE may include a conductive material. As an example, the bottom electrode BE may be formed of or include at least one of conductive metal nitrides (e.g., titanium nitride and tantalum nitride).

A magnetic tunnel junction pattern MTJ may be on the lower interlayered insulating layer 102 and may be electrically connected to the lower contact plug 104 through the bottom electrode BE. The bottom electrode BE may be interposed between the magnetic tunnel junction pattern MTJ and the lower contact plug 104. The magnetic tunnel junction pattern MTJ may include a perpendicular magnetic structure VMS, a free magnetic pattern 150, and a tunnel barrier pattern TBP therebetween.

The perpendicular magnetic structure VMS may include a first pinned pattern 120, a second pinned pattern 140 between the first pinned pattern 120 and the tunnel barrier pattern TBP, and an exchange coupling pattern 130 between the first and second pinned patterns 120 and 140. In other words, the first pinned pattern 120, the exchange coupling pattern 130, the second pinned pattern 140, and the tunnel barrier pattern TBP may be stacked sequentially, with the first pinned pattern closest to the substrate 100.

A first surface of the first pinned pattern 120 may be in contact with a first surface of the exchange coupling pattern 130. A first surface of the second pinned pattern 140 may be in contact with a second surface of the exchange coupling pattern 130, with the second surface of the exchange coupling pattern 130 being opposite from the first surface of the exchange coupling pattern 130. The first pinned pattern 120 and the second pinned pattern 140 may be antiferromagnetically coupled to each other through coupling with the exchange coupling pattern 130.

Each of the first and second pinned patterns 120 and 140 may have a perpendicular magnetization direction. A perpendicular magnetization direction 120$m$ of the first pinned pattern 120 and a perpendicular magnetization direction 140$m$ of the second pinned pattern 140 may be perpendicular to an interface between the tunnel barrier pattern TBP and the free magnetic pattern 150. The perpendicular magnetization direction 120$m$ of the first pinned pattern 120 and the perpendicular magnetization direction 140$m$ of the second pinned pattern 140 may be pinned to respectively different directions. The perpendicular magnetization direction 120$m$ of the first pinned pattern 120 may be antiparallel to the perpendicular magnetization direction 140$m$ of the second pinned pattern 140.

The first and second pinned patterns 120 and 140 may each be a ferromagnetic pattern containing a ferromagnetic element. The first and second pinned patterns 120 and 140 may include at least one of i) a perpendicular magnetic material (e.g., CoFeTb, CoFeGd, and CoFeDy), ii) a perpendicular magnetic material of L10 structure, iii) a CoPt-based material with a hexagonal close packed lattice structure, and iv) a multi-layered structure in which ferromagnetic layers and non-magnetic layers are alternately stacked, v) a cobalt-based full-Heusler alloy.

The perpendicular magnetic material of L10 structure may include at least one of L10 FePt, L10 FePd, L10 CoPd, or L10 CoPt.

The multi-layered structure may include at least one of (Co/Pt)n, (CoFe/Pt)n, (CoFe/Pd)n, (Co/Pd)n, (Co/Ni)n, (CoNi/Pt)n, (CoCr/Pt)n, or (CoCr/Pd)n, where "n" is a natural number equal to or greater than 2. Here, the first and second pinned patterns 120 and 140 may be thicker than the free magnetic pattern 150 or may have coercive forces that are stronger than a coercive force of the free magnetic pattern 150.

The cobalt-based full-Heusler alloy may include at least one of Co2FeSi, Co2MnSi, Co2FeMnSi, Co2FelAl, or Co2CrAl. The exchange coupling pattern 130 may include a non-magnetic material exhibiting an anti-ferromagnetic coupling property. For example, the exchange coupling pattern 130 may include at least one of iridium (Ir), chromium (Cr), or ruthenium (Ru).

The tunnel barrier pattern TBP may include at least one of magnesium oxide, titanium oxide, aluminum oxide, magnesium-zinc oxide, magnesium-boron oxide, titanium nitride, or vanadium nitride. For example, the tunnel barrier pattern TBP may include magnesium oxide (MgO) having the NaCl crystal structure.

The free magnetic pattern 150 may be in contact with the tunnel barrier pattern TBP. The free magnetic pattern 150 may have a perpendicular magnetization property due to a magnetic anisotropy caused by the contact between the free magnetic pattern 150 and the tunnel barrier pattern TBP. A perpendicular magnetization direction 150$m$ of the free magnetic pattern 150 may be changed to be parallel or antiparallel to the perpendicular magnetization direction 140$m$ of the second pinned pattern 140. When the perpendicular magnetization direction 140$m$ of the second pinned pattern 140 is parallel to the perpendicular magnetization direction 150m of the free magnetic pattern 150, the magnetic tunnel junction pattern MTJ may have a low resistance value. By contrast, when the perpendicular magnetization direction 140m of the second pinned pattern 140 is antiparallel to the perpendicular magnetization direction 150m of the free magnetic pattern 150, the magnetic tunnel junction pattern MTJ may have a high resistance value. The free magnetic pattern 150 may include a magnetic material, which can induce a perpendicular magnetic anisotropy at the interface between the free magnetic pattern 150 and the tunnel barrier pattern TBP. The free magnetic pattern 150 may be formed of or include, for example, cobalt-iron-boron (CoFeB).

A seed pattern 110 may be interposed between the magnetic tunnel junction pattern MTJ and the bottom electrode BE. The seed pattern 110 may include a material that allows magnetic layers constituting the magnetic tunnel junction pattern MTJ to be grown in a crystalline structure. The seed pattern 110 may be formed of or include at least one of chromium (Cr), iridium (Ir), or ruthenium (Ru).

An in-plane magnetic structure HMS may be on the magnetic tunnel junction pattern MTJ. The in-plane magnetic structure HMS will be described in greater detail below.

A spacer SP may be interposed between the free magnetic pattern 150 and the in-plane magnetic structure HMS. The spacer SP may include at least one of metallic materials or metal oxides. The metallic material may include, for example, tantalum (Ta). The metal oxides may include at least one of magnesium oxide or tantalum oxide.

A top electrode TE may be on the in-plane magnetic structure HMS. The magnetic tunnel junction pattern MTJ and the in-plane magnetic structure HMS may be interposed between the bottom electrode BE and the top electrode TE, with the in-plane magnetic structure closer to the top electrode TE and the magnetic tunnel junction pattern MTJ closer to the bottom electrode BE. The top electrode TE may include a conductive material. As an example, the top electrode TE may include at least one of metallic materials (e.g., tantalum (Ta), aluminum (Al), copper (Cu), gold (Au), silver (Ag), and titanium (Ti)), or conductive metal nitrides (e.g., tantalum nitride (TaN) and titanium nitride (TiN)).

An upper interlayered insulating layer 106 may be on the lower interlayered insulating layer 102, and may cover side surfaces of the bottom electrode BE, the seed pattern 110, the magnetic tunnel junction pattern MTJ, the in-plane magnetic structure HMS and the top electrode TE. The upper interlayered insulating layer 106 may be formed of or include at least one of an oxide, a nitride, and/or an oxynitride. A conductive line 108 may be on the upper interlayered insulating layer 106. The conductive line 108 may be connected to the in-plane magnetic structure HMS and the magnetic tunnel junction pattern MTJ through the top electrode TE. The conductive line 108 may be formed of or include at least one of metallic materials (e.g., titanium, tantalum, copper, aluminum, and tungsten) or conductive metal nitrides (e.g., titanium nitride and tantalum nitride). In some embodiments, the conductive line 108 may serve as a bit line.

The in-plane magnetic structure HMS may include a first magnetic pattern 160, a second magnetic pattern 180 between the first magnetic pattern 160 and the top electrode TE, and a non-magnetic pattern 170 between the first and second magnetic patterns 160 and 180.

A first surface of the first magnetic pattern 160 may be in contact with a first surface of the spacer SP, and a second surface of the first magnetic pattern 160 may be in contact with a first surface of the non-magnetic pattern 170. A first surface of the second magnetic pattern 180 may be in contact with a second surface of the non-magnetic pattern 170. The first and second magnetic patterns 160 and 180 may be antiferromagnetically coupled to each other by the non-magnetic pattern 170.

Each of the first and second magnetic patterns 160 and 180 may have an in-plane magnetization direction. An in-plane magnetization direction 160m of the first magnetic pattern 160 and an in-plane magnetization direction 180m of the second magnetic pattern 180 may be parallel to an interface between the spacer SP and the free magnetic pattern 150. The in-plane magnetization direction 160m of the first magnetic pattern 160 and the in-plane magnetization direction 180m of the second magnetic pattern 180 may be antiparallel to each other. Both of the magnetization direction 160m of the first magnetic pattern 160 and the magnetization direction 180m of the second magnetic pattern 180 may be perpendicular to both of the magnetization direction 120m of the first pinned pattern 120 and the magnetization direction 140m of the second pinned pattern 140.

In some embodiments, an exchange coupling constant (Jex) between the first and second magnetic patterns 160 and 180 may range from $-0.1$ erg/cm$^2$ to $-2$ erg/cm$^2$.

Each of the first and second magnetic patterns 160 and 180 may include a soft magnetic material. As an example, each of the first and second magnetic patterns 160 and 180 may include at least one of iron (Fe), cobalt (Co), or nickel (Ni). In certain embodiments, the first and second magnetic patterns 160 and 180 may include cobalt-iron-boron (CoFeB). A composition ratio of cobalt-iron-boron (CoFeB) in the first and second magnetic patterns 160 and 180 may differ from a composition ratio of cobalt-iron-boron (CoFeB) of the free magnetic pattern 150.

As an example, composition ratios of boron in the first and second magnetic patterns 160 and 180 may be higher than a composition ratio of boron in the free magnetic pattern 150. The first and second magnetic patterns 160 and 180 having the high boron composition ratio may have crystallinities that are worse than a crystallinity of the free magnetic pattern 150. In the present specification, the term "crystallinity" is used to indicate how regularly the atoms are arranged.

The first magnetic pattern 160 and the second magnetic pattern 180 may have non-crystallinities that are better than the free magnetic pattern 150.

The non-magnetic pattern 170 may include a non-magnetic material exhibiting an anti-ferromagnetic coupling property. As an example, the non-magnetic pattern 170 may be formed of or include at least one of iridium (Ir), chromium (Cr), or ruthenium (Ru)

Each of the first and second magnetic patterns 160 and 180 may have a magnetocrystalline anisotropy energy, which is greater than 0 erg/cm$^3$ and is less than $1 \times 10^7$ erg/cm$^3$. The magnetocrystalline anisotropy energy is an energy, which is required to fix a spin direction that is dependent on a structure and direction of a crystal orientation. When the magnetocrystalline anisotropy energy of each of the first and second magnetic patterns 160 and 180 is within the range of greater than 0 erg/cm$^3$ and less than $1 \times 10^7$ erg/cm$^3$, it may be relatively easy to realize the in-plane magnetization directions of the first and second magnetic patterns 160 and 180. If the magnetocrystalline anisotropy energy is greater than or equal to $1 \times 10^7$ erg/cm$^3$, the first and second magnetic patterns 160 and 180 may have perpendicular or nearly perpendicular magnetization directions. If the magnetocrystalline anisotropy energy is 0 erg/ cm³, the magnetization direction may hardly have a perpendicular component, even when a writing current is applied thereto.

The magnetocrystalline anisotropy energy may be associated with a perpendicular crystal magnetic anisotropy causing the perpendicular magnetization and a shape magnetic anisotropy causing the in-plane magnetization. In the first and second magnetic patterns 160 and 180, the shape magnetic anisotropy may be stronger than the perpendicular magnetic anisotropy. Thus, the first and second magnetic patterns 160 and 180 may stably have the in-plane magnetization directions.

In the case where there is no current supplied from the outside or a current for a reading operation is supplied, the in-plane magnetization direction 160m of the first magnetic pattern 160 and the in-plane magnetization direction 180m of the second magnetic pattern 180 may be perpendicular to the perpendicular magnetization direction 150m of the free magnetic pattern 150. For example, an angle therebetween may be 90° or may be close to 90°.

Each of the first and second magnetic patterns 160 and 180 may exert a stray field to the free magnetic pattern 150. As vectors, a first stray field exerted to the free magnetic pattern 150 by the first magnetic pattern 160 may be opposite to a second stray field exerted to the free magnetic pattern 150 by the second magnetic pattern 180. As such, the first stray field and the second stray field may be destructively interfered to each other. Due to the destructive interference between the stray fields exerted to the free magnetic pattern 150, the thermal stability of the free magnetic pattern 150 may be improved.

As seen in FIG. 1B, the first magnetic pattern 160 may have a first thickness 160T when measured in a direction perpendicular to an interface between the spacer SP and the in-plane magnetic structure HMS. The second magnetic pattern 180 may have a second thickness 180T when measured in the direction perpendicular to the interface between the spacer SP and the in-plane magnetic structure HMS.

In the case where the first and second thicknesses 160T and 180T are smaller than a specific thickness, the first and second magnetic patterns 160 and 180 may have the in-plane magnetization directions. The first thickness 160T of the first magnetic pattern 160 and the second thickness 180T of the second magnetic pattern 180 may be smaller than a thickness 150T of the free magnetic pattern 150, where the thickness 150T of the free magnetic pattern is measured in a direction perpendicular to the interface between the spacer SP and the in-plane magnetic structure HMS. In some embodiments, the largest value of the first thickness 160T of the first magnetic pattern 160 and the largest value of the second thickness 180T of the second magnetic pattern 180 may be smaller than the largest value of the thickness 150T of the free magnetic pattern 150.

As an example, the first thickness 160T of the first magnetic pattern 160 and the second thickness 180T of the second magnetic pattern 180 may range from 0.5 nm to 10 nm.

In some embodiments, the second thickness 180T of the second magnetic pattern 180 may be greater than the first thickness 160T of the first magnetic pattern 160, and in such cases, it may be possible to effectively suppress the stray field. As an example, the largest value of the second thickness 180T of the second magnetic pattern 180 may be greater than the largest value of the first thickness 160T of the first magnetic pattern 160. When the first and second magnetic patterns 160 and 180 have the same thickness, the free magnetic pattern 150 may be more strongly affected by the first stray field than by the second stray field, because the second magnetic pattern 180 is farther from the free magnetic pattern 150 than the first magnetic pattern 160 is.

In the case where, as described above, the second thickness 180T of the second magnetic pattern 180 is greater than the first thickness 160T of the first magnetic pattern 160, it may be possible to maintain the balance of the first and second stray fields exerted to the free magnetic pattern. In some embodiments, the second thickness 180T of the second magnetic pattern 180 may be substantially equal to the first thickness 160T of the first magnetic pattern 160.

Figure 2A:
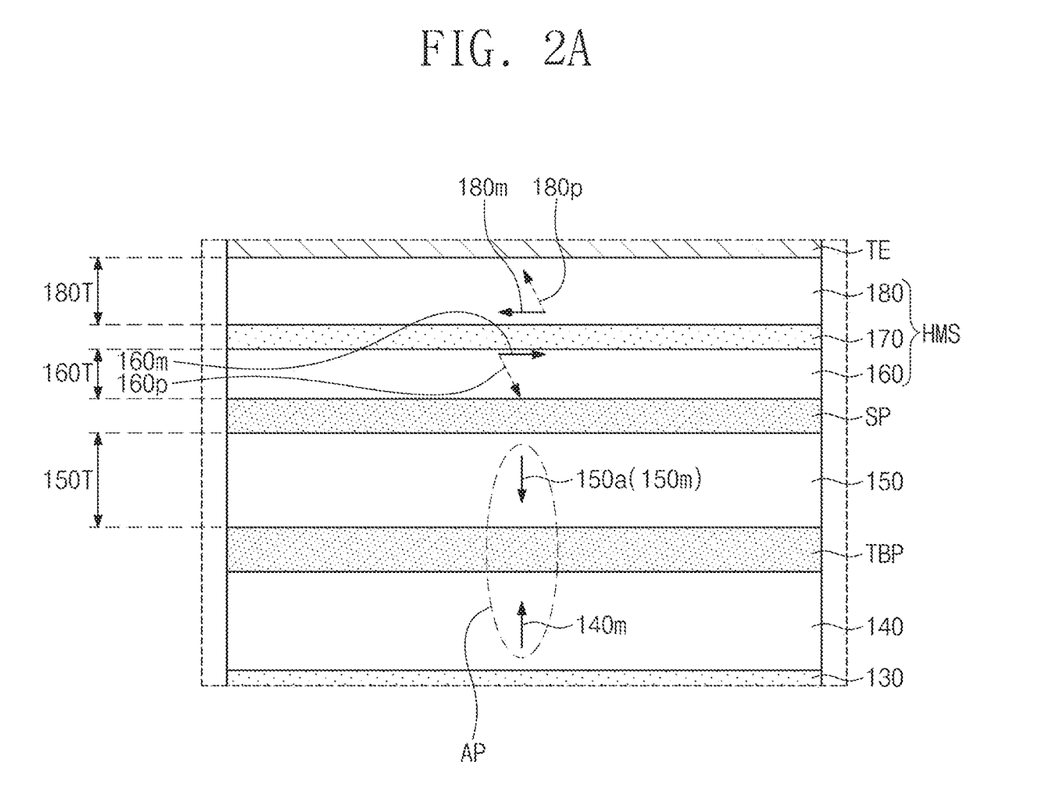
FIGS. 2A and 2B are sectional views illustrating a change in magnetization direction of a magnetic memory device in a writing operation.
Figure 2B:
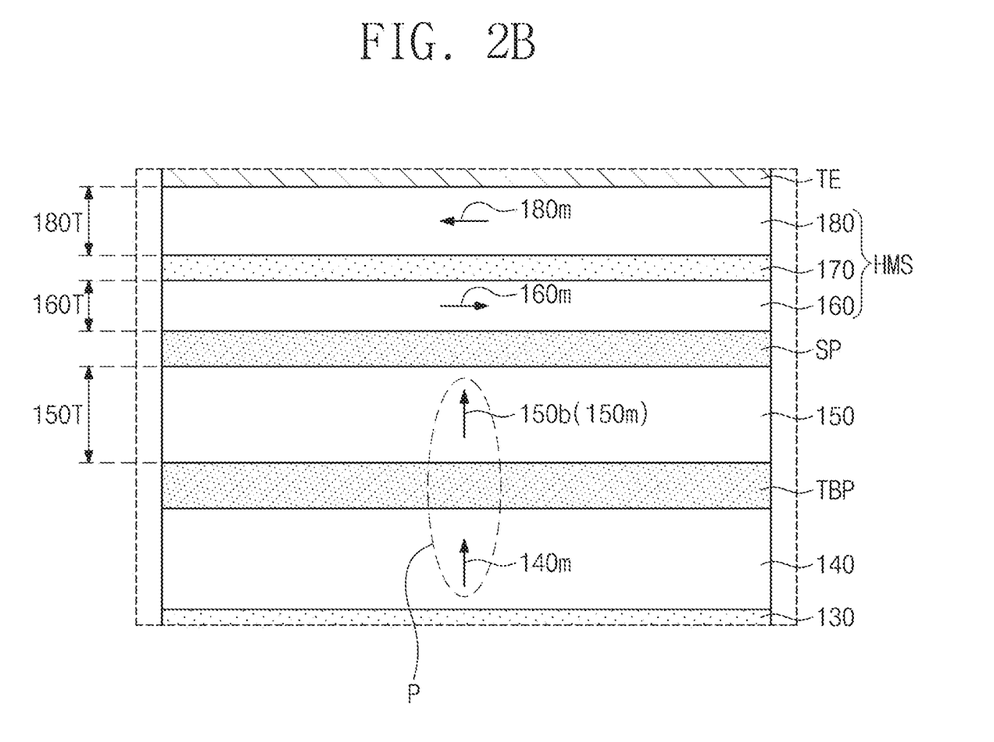

FIGS. 2A and 2B are sectional views illustrating a change in magnetization direction of a magnetic memory device in a writing operation. For example, FIGS. 2A and 2B are sectional views corresponding to the portion 'aa' of FIG. 1A.

Referring to FIG. 2A, the free magnetic pattern 150 may be provided to have a first perpendicular magnetization direction 150a that is antiparallel to the perpendicular magnetization direction 140m of the second pinned pattern 140 (e.g., as shown in the ellipse AP). A writing current may be applied to switch the first perpendicular magnetization direction 150a of the free magnetic pattern 150. In some embodiments, the writing current may be a DC current flowing from the top electrode TE to the bottom electrode BE. This means that electrons flow in a direction from the bottom electrode BE toward the top electrode TE.

In this case, the orientation of the free magnetic pattern 150 may receive spin transfer torque from electrons polarized by the second pinned pattern 140 pinned Similarly, the orientation of the first magnetic pattern 160 may receive spin transfer torque from electrons polarized by the free magnetic pattern 150.

As a result of the spin transfer torque, the first magnetic pattern 160 may have a non-vanishing perpendicular magnetization component 160p. The second magnetic pattern 180, which is antiferromagnetically coupled to the first magnetic pattern 160, may also have a non-vanishing perpendicular magnetization component 180p. As a vector, the perpendicular magnetization component 160p of the first magnetic pattern 160 may be antiparallel to the perpendicular magnetization component 180p of the second magnetic pattern 180.

In the case where the first magnetic pattern 160 has the non-vanishing perpendicular magnetization component 160p, the first magnetic pattern 160 may exert an additional spin transfer torque to the free magnetic pattern 150 in the perpendicular direction.

As such, it may be possible to reduce a threshold current required to switch the first perpendicular magnetization direction 150a of the free magnetic pattern 150.

In some embodiments, the first magnetic pattern 160 may have a thickness that is smaller than a specific thickness, and in this case, the first magnetic pattern 160 may receive the spin transfer torque effectively. As an example, the thickness 160T of the first magnetic pattern 160 may be smaller than the thickness 150T of the free magnetic pattern 150. As an example, the largest value of the first thickness 160T of the first magnetic pattern 160 may be smaller than the largest value of the thickness 150T of the free magnetic pattern 150.

Referring to FIG. 2B, the first perpendicular magnetization direction 150a of the free magnetic pattern 150 may be changed to a second perpendicular magnetization direction 150b that is parallel to the perpendicular magnetization direction 140m of the second pinned pattern 140 (e.g., as shown in the ellipse P).

Since, as described above, the stray field from the first magnetic pattern 160 may be cancelled or reduced by the stray field from the second magnetic pattern 180, the free magnetic pattern 150 may have high thermal stability, and thus, the second perpendicular magnetization direction 150b of the free magnetic pattern 150 may not be changed to the first perpendicular magnetization direction 150a.

According to some embodiments of the inventive concepts, the magnetic memory device may include a magnetic tunnel junction pattern, which includes a pinned pattern with at least one perpendicular magnetization direction, and the first and second magnetic patterns 160 and 180, which have in-plane magnetization directions and are antiferromagnetically coupled to each other. Thus, it may be possible to improve thermal stability of the magnetic memory device and to reduce a threshold value of a switching current.

Figure 3:
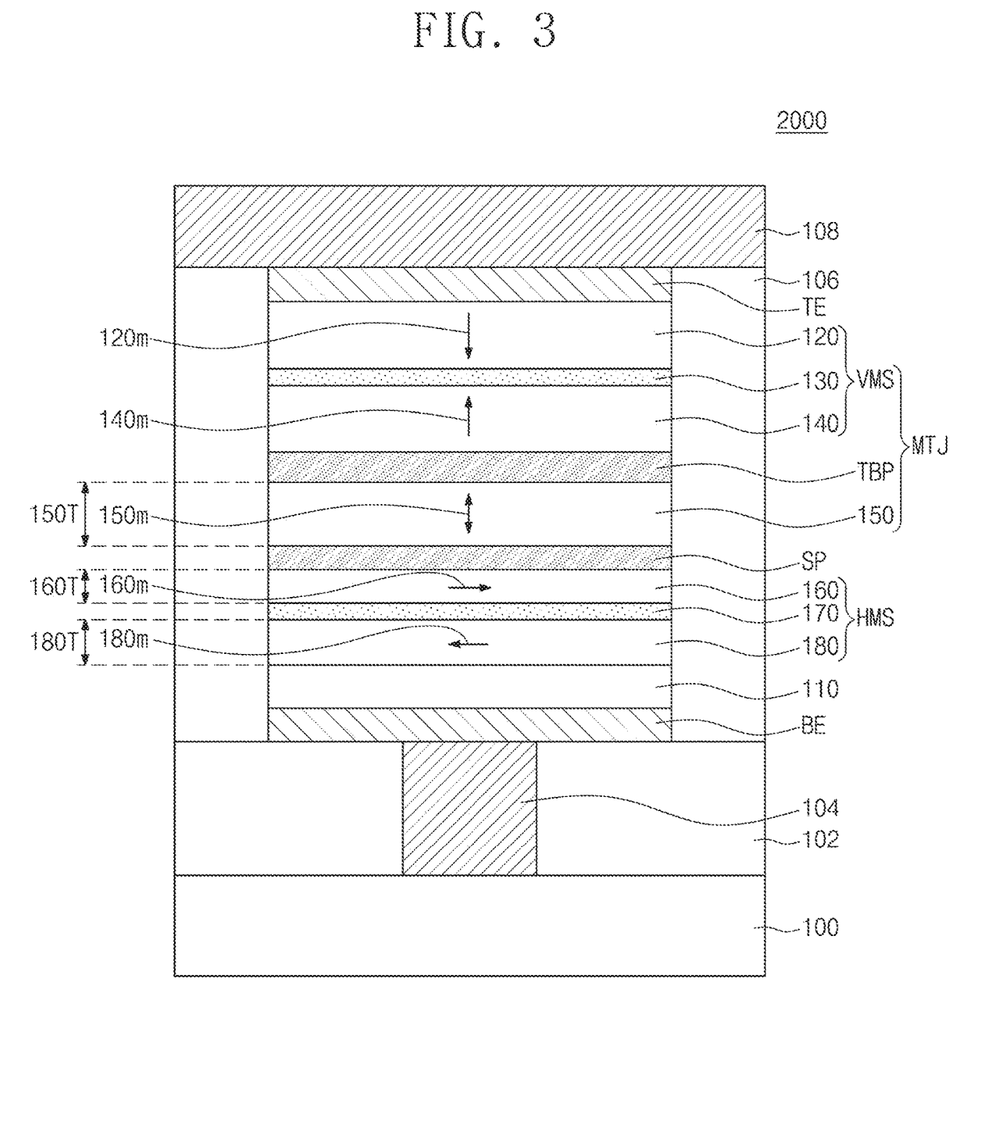
FIG. 3 is a sectional view illustrating a magnetic memory device according to some embodiments of the inventive concepts.

FIG. 3 is a sectional view illustrating a magnetic memory device according to some embodiments of the inventive concepts. For concise description, elements previously described with reference to FIGS. 1A and 1B may be identified by the same reference number without repeating an overlapping description thereof.

Referring to FIG. 3, the in-plane magnetic structure HMS may be on the lower interlayered insulating layer 102 and may be electrically connected to the lower contact plug 104 through the bottom electrode BE. The seed pattern 110 may be interposed between the in-plane magnetic structure HMS and the bottom electrode BE.

The in-plane magnetic structure HMS may include the second magnetic pattern 180, the first magnetic pattern 160 on the second magnetic pattern 180, and the non-magnetic pattern 170 therebetween.

The magnetic tunnel junction pattern MTJ may be on the in-plane magnetic structure HMS. The spacer SP may be provided between the in-plane magnetic structure HMS and the magnetic tunnel junction pattern MTJ.

The magnetic tunnel junction pattern MTJ may include the free magnetic pattern 150, the perpendicular magnetic structure VMS on the free magnetic pattern 150, and the tunnel barrier pattern TBP therebetween. The perpendicular magnetic structure VMS may include the second pinned pattern 140, the first pinned pattern 120 on the second pinned pattern 140, and the exchange coupling pattern 130 therebetween.

The top electrode TE may be on the magnetic tunnel junction pattern MTJ. The magnetic tunnel junction pattern MTJ may be between the top electrode TE and the in-plane magnetic structure HMS. The magnetic tunnel junction pattern MTJ and the in-plane magnetic structure HMS may be interposed between the bottom electrode BE and the top electrode TE, with the in-plane magnetic structure closer to the bottom electrode BE and the magnetic tunnel junction pattern MTJ closer to the top electrode TE.

Figure 4:
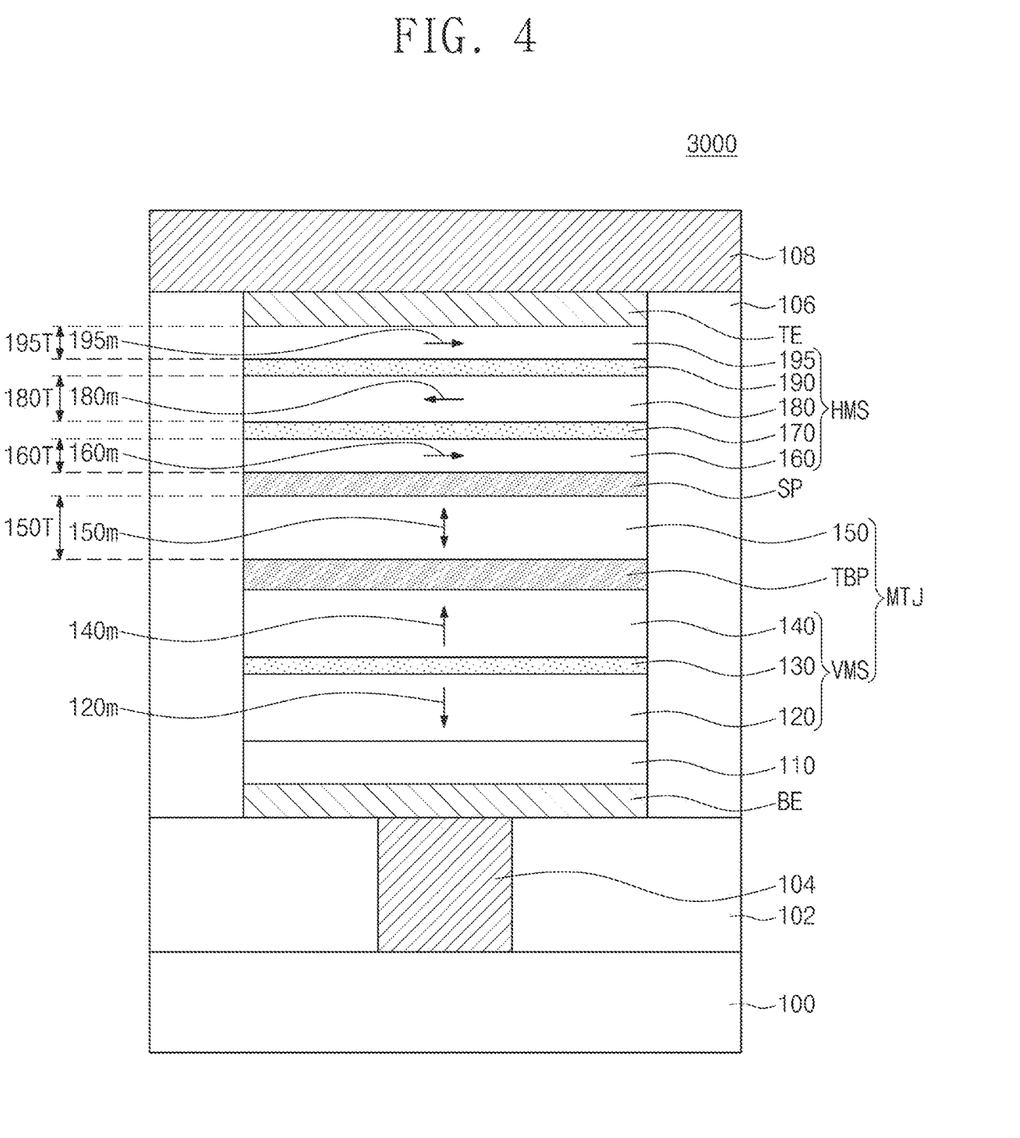
FIG. 4 is a sectional view illustrating a magnetic memory device according to some embodiments of the inventive concepts.

FIG. 4 is a sectional view illustrating a magnetic memory device 3000 according to some embodiments of the inventive concepts. For concise description, elements previously described with reference to FIGS. 1A and 1B may be identified by the same reference number without repeating an overlapping description thereof.

Referring to FIG. 4, the in-plane magnetic structure HMS may include a first magnetic pattern 160, a first non-magnetic pattern 170, a second magnetic pattern 180, a second non-magnetic pattern 190, and a third magnetic pattern 195, which may be sequentially stacked.

A first surface of the second non-magnetic pattern 190 may be in contact with a first surface of the second magnetic pattern 180, and a second surface of the second non-magnetic pattern 190 may be in contact with a first surface of the third magnetic pattern 195. The second magnetic pattern 180 and the third magnetic pattern 195 may be antiferromagnetically coupled to each other by the second non-magnetic pattern 190.

The third magnetic pattern 195 may have a magnetization direction 195m that is parallel to the magnetization direction 160m of the first magnetic pattern 160 and is antiparallel to the magnetization direction 180m of the second magnetic pattern 180. In some embodiments, an exchange coupling constant between the second magnetic pattern 180 and the third magnetic pattern 195 may range from $-0.1$ erg/cm$^2$ to $-2$ erg/cm$^2$.

The third magnetic pattern 195 may be formed of or include a soft magnetic material. As an example, the third magnetic pattern 195 may include at least one of iron (Fe), cobalt (Co), or nickel (Ni). In some embodiments, the first, second, and third magnetic patterns 160, 180, and 195 may include nickel (Ni), cobalt (Co), and boron (B). Composition ratios of cobalt-iron-boron (CoFeB) in the first, second, and third magnetic patterns 160, 180, and 195 may differ from a composition ratio of cobalt-iron-boron (CoFeB) in the free magnetic pattern 150. For example, the composition ratio of boron in each of the first, second, and third magnetic patterns 160, 180, and 195 may be higher than the composition ratio of boron in the free magnetic pattern 150. The first, second, and third magnetic patterns 160, 180, and 195 having a high boron composition ratio may have a crystallinity that is smaller than that of the free magnetic pattern 150.

A magnetocrystalline anisotropy energy of the third magnetic pattern 195 may be greater than 0 and may be smaller than or equal to $1 \times 10^7$ erg/cm$^3$.

The third magnetic pattern 195 may have a third thickness 195T measured in a direction perpendicular to the interface between the spacer SP and the in-plane magnetic structure HMS. The third thickness 195T of the third magnetic pattern 195 may be smaller than the second thickness 180T of the second magnetic pattern 180. As an example, the largest value of the third thickness 195T of the third magnetic pattern 195 may be smaller than the largest value of the second thickness 180T of the second magnetic pattern 180.

Figure 5:
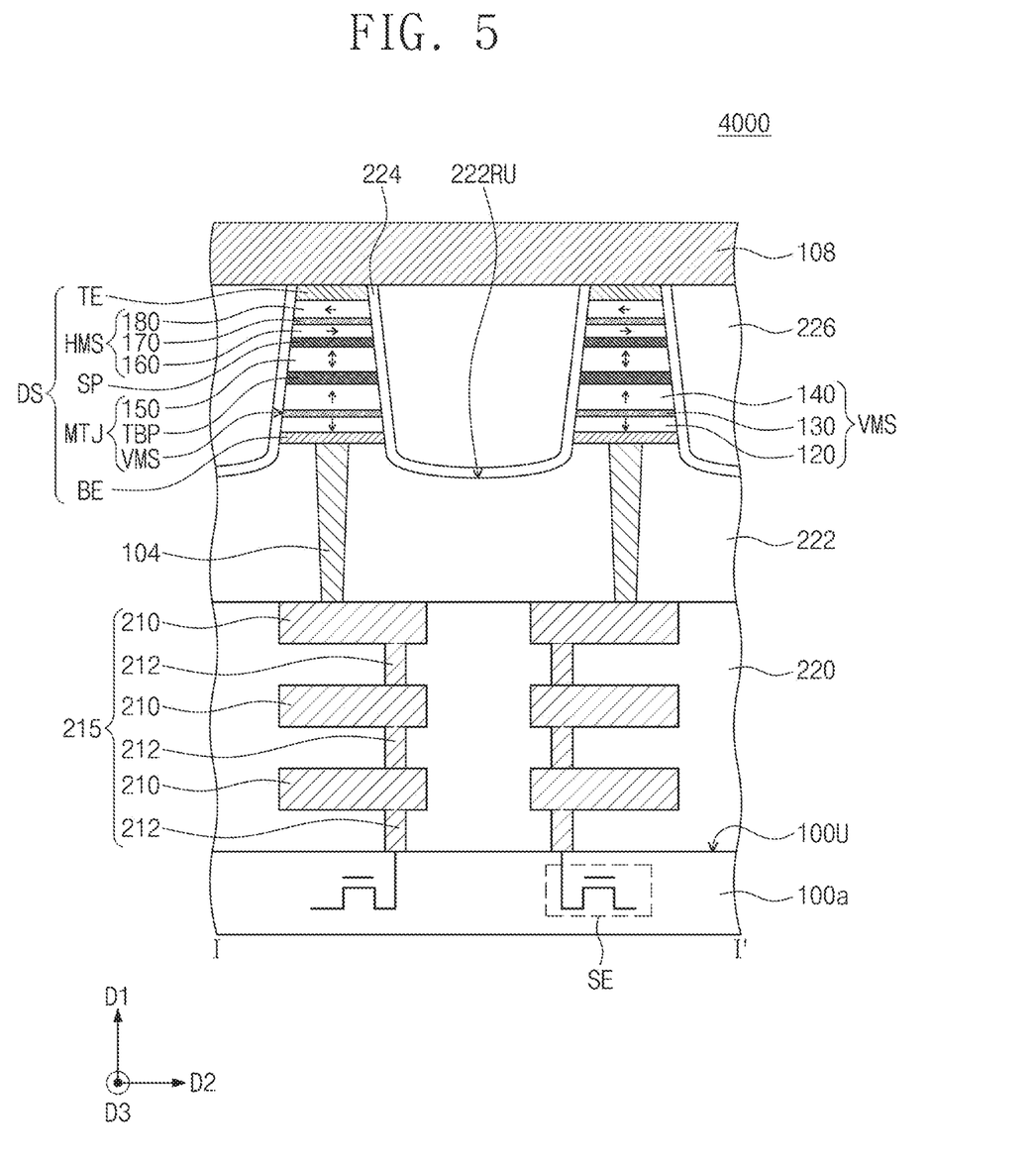
FIG. 5 is a sectional view illustrating a magnetic memory device according to some embodiments of the inventive concepts.

FIG. 5 is a sectional view illustrating a magnetic memory device 4000 according to some embodiments of the inventive concepts. For concise description, elements previously described with reference to FIGS. 1A and 1B may be identified by the same reference number without repeating an overlapping description thereof.

Referring to FIG. 5, an interconnection structure 215 may be disposed on a substrate 100a.

The substrate 100a may be a semiconductor substrate, such as silicon (Si), silicon-on-insulator (SOI), silicon germanium (SiGe), germanium (Ge), and gallium arsenide (GaAs) wafers. The interconnection structure 215 may include interconnection lines 210, which are spaced apart from each other in a first direction D1 perpendicular to a top surface of the substrate 100a. The interconnection lines 210 may be extended in a second direction D2 parallel to the top surface of the substrate 100a. The lowermost ones of the interconnection lines 210 may be spaced apart from the substrate 100a in the first direction D1. The interconnection structure 215 may further include contacts 212, which are between the lowermost ones of the interconnection lines 210 and the substrate 100 and between the interconnection lines 210. Some of the contacts 212 may connect the lowermost ones of the interconnection lines 210 to the substrate 100a, and others of the contacts 212 may connect the interconnection lines 210 to each other. The interconnection lines 210 and the contacts 212 may be formed of or include at least one of metallic materials (e.g., copper).

Selection elements SE may be arranged in a substrate 110a. The selection elements SE may be, for example, field effect transistors. The lowermost ones of the interconnection lines 210 may be electrically connected to terminals of the selection elements SE through the contacts 212 connected thereto.

A first interlayered insulating layer 220 may be on the substrate 100a to cover the interconnection structure 215. The topmost ones of the interconnection lines 210 may have top surfaces that are positioned at the same height as the top surface of the first interlayered insulating layer 220. In the present specification, the term "height" may mean a distance from a top surface 100U of the substrate 100a in the first direction D1. The first interlayered insulating layer 220 may be formed of or include at least one of oxide, nitride, and/or oxynitride.

A second interlayered insulating layer 222 may be on the first interlayered insulating layer 220 and may cover top surfaces of topmost ones of the interconnection lines 210. The lower contact plugs 104 may be in the second interlayered insulating layer 222 and on the interconnection structure 215. The lower contact plugs 104 may be two-dimensionally arranged in second and third directions D2 and D3, on the interconnection structure 215. The lower contact plugs 104 may be extended in the first direction D1 and may have side surfaces that are inclined at an angle to the top surface 100U of the substrate 100a.

The second and third directions D2 and D3 may be parallel to the top surface 100U of the substrate 100a and may not be parallel to each other. Each of the lower contact plugs 104 may be provided to penetrate the second interlayered insulating layer 222 and may be connected to the topmost one of the interconnection lines 210. As an example, each of the lower contact plugs 104 may be in contact with a top surface of a corresponding one of the topmost interconnection lines 210. Each of the lower contact plugs 104 may be electrically connected to a terminal of a corresponding one of the selection elements SE through the interconnection structure 215.

Data storage structures DS may be on the lower contact plugs 104. The data storage structures DS may be two-dimensionally arranged in the second direction D2 and the third direction D3 and may be on the lower contact plugs 104, respectively. Between the data storage structures DS, the second interlayered insulating layer 222 may have a recessed top surface 222RU.

A third interlayered insulating layer 226 may be on the second interlayered insulating layer 222 to cover the data storage structures DS. The third interlayered insulating layer 226 may cover the recessed top surface 222RU of the second interlayered insulating layer 222 and may cover side surfaces of the data storage structures DS. A protection insulating layer 224 may be interposed between the side surface of each of the data storage structures DS and the third interlayered insulating layer 226. The protection insulating layer 224 may enclose the side surface of each of the data storage structures DS. The protection insulating layer 224 may be extended from the side surface of each of the data storage structures DS into a region between the second and third interlayered insulating layers 222 and 226. The protection insulating layer 224 may be interposed between the recessed top surface 222RU of the second interlayered insulating layer 222 and the third interlayered insulating layer 226. The protection insulating layer 224 may be formed of or include nitride (e.g., silicon nitride), and the third interlayered insulating layer 226 may be formed of or include at least one of an oxide, a nitride, or an oxynitride.

The conductive lines 108 may be on the third interlayered insulating layer 226. The conductive lines 108 may be extended in the second direction D2 and may be spaced apart from each other in the third direction D3. Each of the conductive lines 108 may be connected in common to some of the data storage structures DS arranged in the second direction D2. The conductive lines 108 may include a metal (e.g., copper). The conductive lines 108 may serve as the bit lines.

Each of the data storage structures DS may include the bottom electrode BE, the magnetic tunnel junction pattern MTJ, the spacer SP, the in-plane magnetic structure HMS, and the top electrode TE, which are sequentially stacked on the lower contact plugs 104. Each of the data storage structures DS may further include a seed pattern between the bottom electrode BE and the magnetic tunnel junction pattern MTJ. Each of the data storage structures DS may have a trapezoidal section and may have an inclined side surface.

Each element of the data storage structures DS may be substantially the same as a corresponding element of the magnetic memory device described with reference to FIGS. 1A and 1B.

Figure 6A:
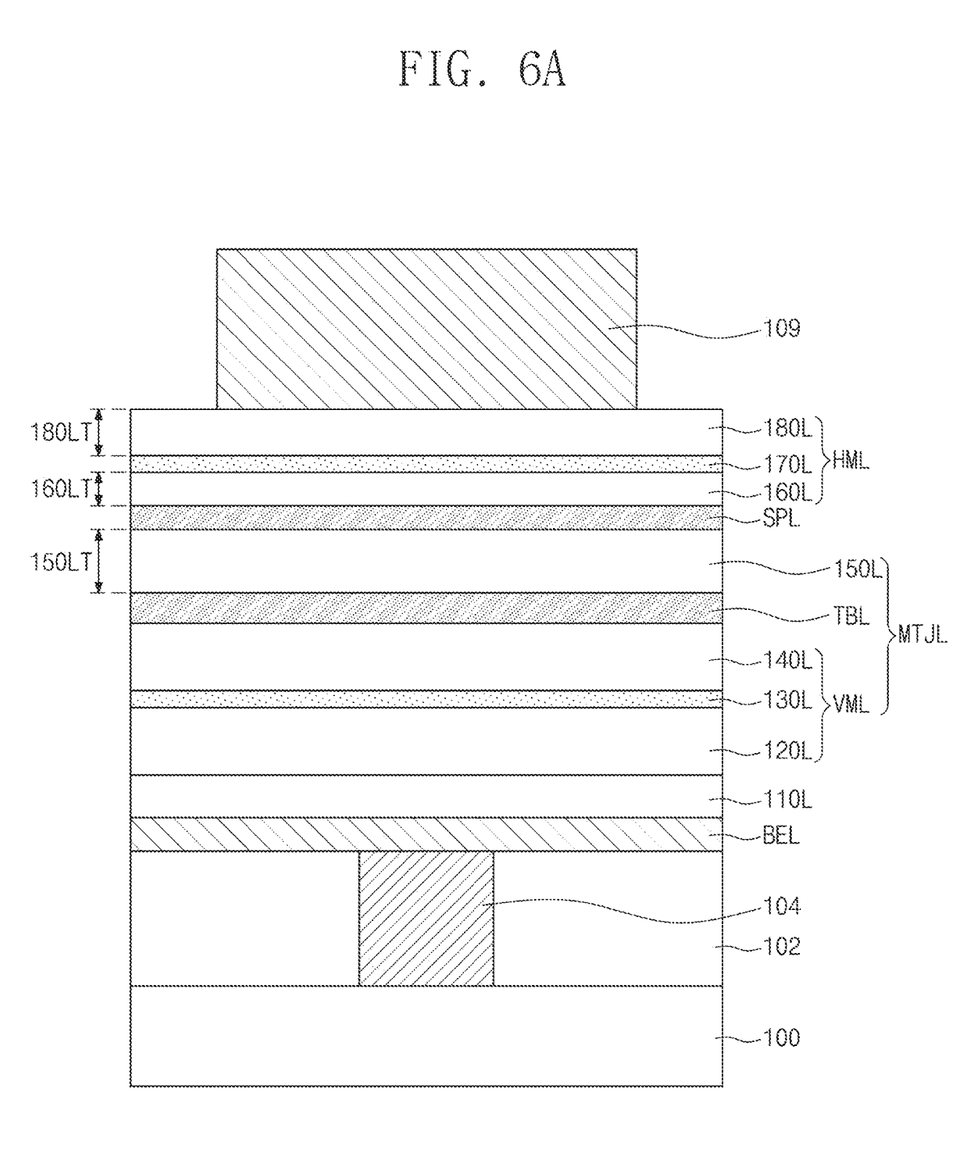
FIGS. 6A and 6B are sectional views illustrating a method of fabricating a magnetic memory device, according to some embodiments of the inventive concepts.
Figure 6B:
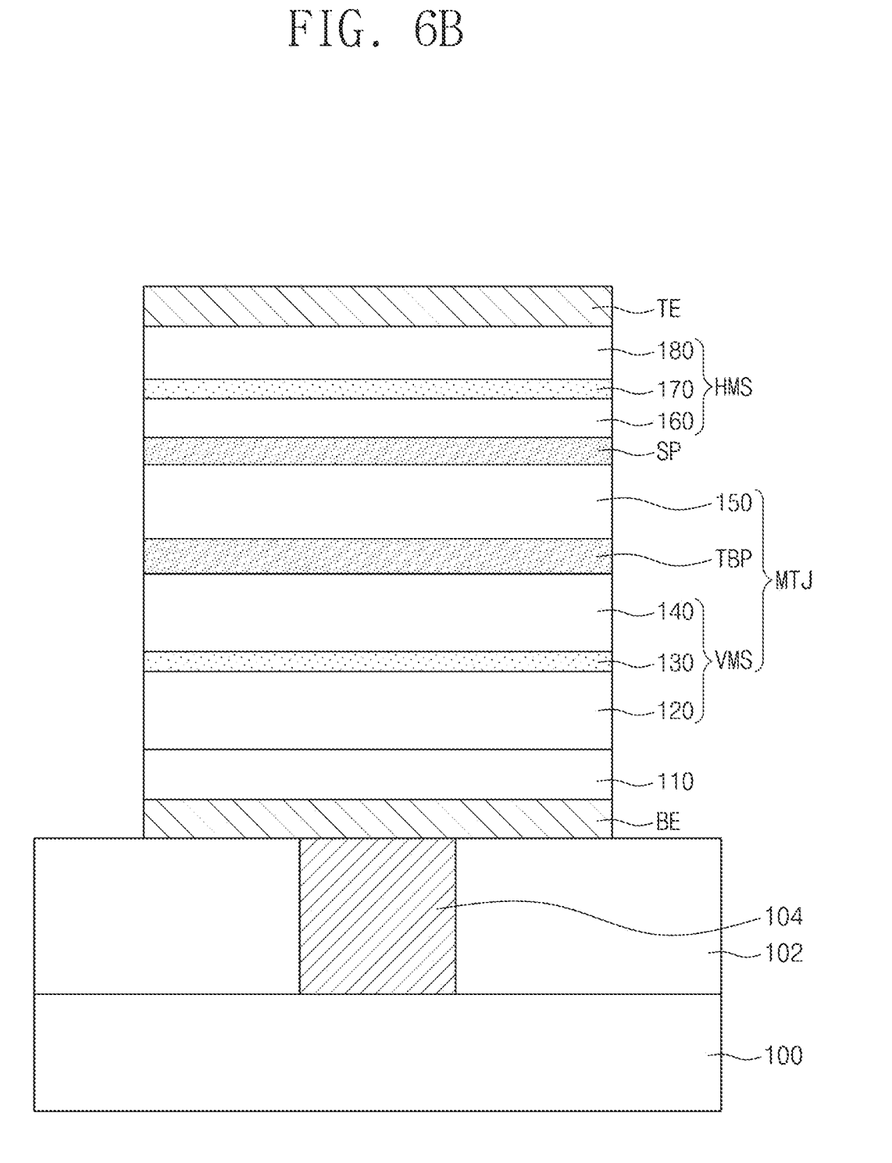

FIGS. 6A and 6B are sectional views illustrating a method of fabricating a magnetic memory device, according to some embodiments of the inventive concepts. For concise description, elements previously described with reference to FIGS. 1A and 1B may be identified by the same reference number without repeating an overlapping description thereof.

Referring to FIG. 6A, the lower interlayered insulating layer 102 may be formed on the substrate 100. The substrate 100 may include a semiconductor substrate. For example, the substrate 100 may be or include a silicon substrate, a germanium substrate, or a silicon-germanium substrate. Selection elements (not shown) may be formed on the substrate 100, and the lower interlayered insulating layer 102 may be formed to cover the selection elements. The selection elements may be field effect transistors or diodes. Thereafter, the lower contact plug 104 may be formed in the lower interlayered insulating layer 102, and the formation of the lower contact plug 104 may include forming a lower contact hole in the lower interlayered insulating layer 102 and forming a lower contact layer to fill the lower contact hole.

A bottom electrode layer BEL may be formed on the lower interlayered insulating layer 102. The bottom electrode layer BEL may be formed of or include at least one of conductive metal nitrides (e.g., titanium nitride and tantalum nitride). A seed layer 110L may be formed on the bottom electrode layer BEL. The seed layer 110L may be formed of or include a material (e.g., iridium (Ir) and ruthenium (Ru)), allowing a magnetic layer thereon to be grown in a crystalline structure. The bottom electrode layer BEL and the seed layer 110L may be formed by a sputtering deposition process, a chemical vapor deposition process, or an atomic layer deposition process.

A first pinned layer 120L may be formed on the seed layer 110L. The first pinned layer 120L may be a ferromagnetic layer containing a ferromagnetic material. The first pinned layer 120L may include at least one of i) a perpendicular magnetic material (e.g., CoFeTb, CoFeGd, and CoFeDy), ii) a perpendicular magnetic material of L10 structure, iii) a CoPt-based material with a hexagonal close packed lattice structure, and iv) a multi-layered structure in which ferromagnetic layers and non-magnetic layers are alternately stacked, v) a cobalt-based full-Heusler alloy.

The perpendicular magnetic material of L10 structure may include at least one of L10 FePt, L10 FePd, L10 CoPd, or L10 CoPt.

The multi-layered structure may include at least one of (Co/Pt)n, (CoFe/Pt)n, (CoFe/Pd)n, (Co/Pd)n, (Co/Ni)n, (CoNi/Pt)n, (CoCr/Pt)n, or (CoCr/Pd)n, where "n" is a natural number equal to or greater than 2. The cobalt-based full-Heusler alloy may include at least one of Co2FeSi, Co2MnSi, Co2FeMnSi, Co2FelAl, or Co2CrAl.

The first pinned layer 120L may be formed by a sputtering deposition process, a chemical vapor deposition process, or an atomic layer deposition process.

An exchange coupling layer 130L may be formed on the first pinned layer 120L. The exchange coupling layer 130L may be formed of or include a non-magnetic material exhibiting an anti-ferromagnetic coupling property and may be formed by a sputtering deposition process, a chemical vapor deposition process, or an atomic layer deposition process.

A second pinned layer 140L may be formed on the exchange coupling layer 130L. The second pinned layer 140L may be formed of or include, for example, the same ferromagnetic material as the first pinned layer 120L. The second pinned layer 140L may be formed by a sputtering deposition process, a chemical vapor deposition process, or an atomic layer deposition process. The first pinned layer 120L, the exchange coupling layer 130L, and the second pinned layer 140L may constitute a perpendicular magnetic layer VML.

A tunnel barrier layer TBL may be formed on the perpendicular magnetic layer VML. The tunnel barrier layer TBL may be formed of or include at least one of magnesium oxide, titanium oxide, aluminum oxide, magnesium-zinc oxide, or magnesium-boron oxide and may be formed of or include by, for example, a sputtering deposition process.

A free magnetic layer 150L may be formed on the tunnel barrier layer TBL. When the free magnetic layer 150L is deposited, the free magnetic layer 150L may have an amorphous structure, and may be formed of or include, for example, cobalt-iron-boron (CoFeB). The free magnetic layer 150L may be formed by a sputtering deposition process, a chemical vapor deposition process, or an atomic layer deposition process. The free magnetic layer 150L may be crystallized by a subsequent thermal treatment process, in which the tunnel barrier layer TBL is used as a seed layer.

The perpendicular magnetic layer VML, the tunnel barrier layer TBL, and the free magnetic layer 150L may constitute a magnetic tunnel junction layer MTJL.

A spacer layer SPL may be formed on the magnetic tunnel junction layer MTJL. The spacer layer SPL may be formed of or include at least one of metallic materials or metal oxide materials. In some embodiments, the metallic materials may include tantalum (Ta), and the metal oxide materials may include magnesium oxide and tantalum oxide. The spacer layer SPL may be formed by, for example, a sputtering deposition process.

A first magnetic layer 160L may be formed on the spacer layer SPL. The first magnetic layer 160L may be formed to have a thickness 160LT that is smaller than a thickness 150LT of the free magnetic layer 150L. The first magnetic layer 160L may be formed of or include a soft magnetic material. As an example, the first magnetic layer 160L may be formed of or include at least one of iron (Fe), cobalt (Co), or nickel (Ni). In some embodiments, the first magnetic layer 160L may include cobalt-iron-boron (CoFeB), and a composition ratio of cobalt-iron-boron (CoFeB) in the first magnetic layer 160L may differ from a composition ratio of cobalt-iron-boron (CoFeB) in the free magnetic layer 150L. The first magnetic layer 160L may be formed by a sputtering deposition process, a chemical vapor deposition process, or an atomic layer deposition process.

A non-magnetic layer 170L may be formed on the first magnetic layer 160L. The non-magnetic layer 170L may be formed of or include a non-magnetic material exhibiting an anti-ferromagnetic coupling property and may be formed by a sputtering deposition process, a chemical vapor deposition process, or an atomic layer deposition process.

A second magnetic layer 180L may be formed on the non-magnetic layer 170L. The second magnetic layer 180L may be formed to have a thickness 180LT that is greater than the thickness 160LT of the first magnetic layer 160L. For example, the second magnetic layer 180L may be formed of or include the same soft magnetic material as the first magnetic layer 160L. The second magnetic layer 180L may be formed by a sputtering deposition process, a chemical vapor deposition process, or an atomic layer deposition process.

The first magnetic layer 160L, the non-magnetic layer 170L, and the second magnetic layer 180L may constitute an in-plane magnetic layer HTML.

A conductive mask pattern 109 may be formed on the in-plane magnetic layer HML. The conductive mask pattern 109 may be formed of or include at least one of tungsten, titanium, aluminum, or metal nitrides (e.g., titanium nitride and tantalum nitride). The conductive mask pattern 109 may define a region, in which the magnetic tunnel junction pattern will be formed.

Referring to FIG. 6B, an etching process may be performed using the conductive mask pattern 109 as an etch mask. The etching process may be, for example, an ion beam etching process. The in-plane magnetic layer HML, the spacer layer SPL, the magnetic tunnel junction layer MTJL, the seed layer 110L, and the bottom electrode layer BEL may be sequentially etched by the etching process to form the in-plane magnetic structure HMS, the spacer SP, the magnetic tunnel junction pattern MTJ, the seed pattern 110, and the bottom electrode BE, respectively.

The in-plane magnetic structure HMS may include the first magnetic pattern 160, the non-magnetic pattern 170, and the second magnetic pattern 180, which are sequentially stacked on the spacer SP.

The magnetic tunnel junction pattern MTJ may include the perpendicular magnetic structure VMS, the tunnel barrier pattern TBP, and the free magnetic pattern 150, which are sequentially stacked on the seed pattern 110. The perpendicular magnetic structure VMS may include the first pinned pattern 120, the second pinned pattern 140 between the first pinned pattern 120 and the tunnel barrier pattern TBP, and the exchange coupling pattern 130 between the first and second pinned patterns 120 and 140.

A portion of the conductive mask pattern 109 may be left on the in-plane magnetic structure HMS, after the etching process, and in this case, such a unremoved portion of the conductive mask pattern 109 may be used as the top electrode TE.

Referring back to FIG. 1A, the upper interlayered insulating layer 106 may be formed on the lower interlayered insulating layer 102 to cover the bottom electrode BE, the seed pattern 110, the magnetic tunnel junction pattern MTJ, the spacer SP, the in-plane magnetic structure HMS, and the top electrode TE. The conductive line 108 may be formed on the upper interlayered insulating layer 106, and the conductive line 108 may be electrically coupled to the in-plane magnetic structure HMS through the top electrode TE.

According to some embodiments of the inventive concepts, a magnetic memory device may include a perpendicular magnetic structure, a free magnetic pattern with a perpendicular magnetization direction, and first and second magnetic patterns, which have in-plane magnetization directions and are antiferromagnetically coupled to each other. The antiferromagnetic coupling between the first and second magnetic patterns may reduce a stray field affecting the free magnetic pattern, and thus, it may be possible to improve the thermal stability of the magnetic memory device. In addition, when a magnetization direction of the free magnetic pattern is switched, the first magnetic pattern may exert an additional spin transfer torque to the free magnetic pattern, and thus, a switching current, which is required to switch the magnetization of the free magnetic pattern, may be reduced.

While example embodiments of the inventive concepts of the present disclosure have been particularly shown and described, it will be understood by one of ordinary skill in the art that variations in form and detail may be made therein without departing from the scope of the attached claims.

What is claimed is:

1. A magnetic memory device, comprising:
   a perpendicular magnetic structure comprising at least one pinned pattern having a perpendicular magnetization direction pinned to a specific direction;
   an in-plane magnetic structure comprising first and second magnetic patterns each having a different respective in-plane magnetization direction;
   a free magnetic pattern having a switchable perpendicular magnetization direction and between the perpendicular magnetic structure and the in-plane magnetic structure; and
   a tunnel barrier pattern between the perpendicular magnetic structure and the free magnetic pattern.

2. The device of claim 1, wherein the first magnetic pattern is closer to the free magnetic pattern than the second magnetic pattern, and wherein a maximum thickness of the second magnetic pattern in a first direction is greater than a maximum thickness of the first magnetic pattern in the first direction.

3. The device of claim 1, wherein the first and second magnetic patterns comprise at least one of nickel (Ni), iron (Fe), or cobalt (Co).

4. The device of claim 1, wherein each of the first magnetic pattern, the second magnetic pattern, and the free magnetic pattern comprises cobalt (Co), iron (Fe), and boron (B), and wherein a composition ratio of the free magnetic pattern differs from composition ratios of the first and second magnetic patterns.

5. The device of claim 4, wherein composition ratios of boron in the first and second magnetic patterns are higher than a composition ratio of boron in the free magnetic pattern.

6. The device of claim 1, wherein the in-plane magnetization direction of the first magnetic pattern is antiparallel to the in-plane magnetization direction of the second magnetic pattern.

7. The device of claim 1, wherein a magnetocrystalline anisotropy energy of each of the first and second magnetic patterns is greater than 0 erg/cm$^3$ and is smaller than $1\times10^7$ erg/cm$^3$.

8. The device of claim 1, wherein an exchange coupling constant (Jex) between the first and second magnetic patterns ranges from −0.1 erg/cm2 to −2 erg/cm2.

9. The device of claim 1, further comprising a spacer between the in-plane magnetic structure and the free magnetic pattern, wherein the spacer comprises a metal oxide or a metal.

10. The device of claim 9, wherein the metal oxide comprises magnesium oxide or tantalum oxide, and wherein the metal comprises tantalum.

11. The device of claim 1, further comprising a non-magnetic pattern between the first and second magnetic patterns, wherein the non-magnetic pattern comprises at least one of iridium (Ir), chromium (Cr), or ruthenium (Ru).

12. The device of claim 1, wherein the perpendicular magnetic structure comprises a first pinned pattern, a second pinned pattern, and an exchange coupling pattern therebetween, and wherein the first and second pinned patterns are antiferromagnetically coupled to each other.

13. The device of claim 1, wherein a thickness of each of the first and second magnetic patterns is larger than or equal to 0.5 nm and is smaller than 10 nm.

14. A magnetic memory device, comprising:
    a perpendicular magnetic structure comprising at least one pinned pattern having a perpendicular magnetization direction pinned to a specific direction;
    an in-plane magnetic structure comprising a first magnetic pattern, a second magnetic pattern, and a first non-magnetic pattern therebetween;
    a free magnetic pattern having a magnetization direction that is switchable between parallel and antiparallel to the perpendicular magnetization direction of the at least one pinned pattern, wherein the free magnetic pattern is between the perpendicular magnetic structure and the in-plane magnetic structure; and
    a tunnel barrier pattern between the perpendicular magnetic structure and the free magnetic pattern,
    wherein a magnetization direction of each of the first and second magnetic patterns of the in-plane magnetic structure is perpendicular to the magnetization direction of the free magnetic pattern, and
    wherein the first and second magnetic patterns of the in-plane magnetic structure are antiferromagnetically coupled to each other by the first non-magnetic pattern.

15. The device of claim 14, wherein a thickness of each of the first and second magnetic patterns is smaller than a thickness of the free magnetic pattern.

16. The device of claim 14, wherein the in-plane magnetic structure further comprises a third magnetic pattern, wherein the third magnetic pattern is spaced apart from the first magnetic pattern, with the second magnetic pattern interposed therebetween, and wherein the third magnetic pattern has an in-plane magnetization direction.

17. The device of claim 16, wherein the third magnetic pattern is antiferromagnetically coupled to the second magnetic pattern, and wherein a thickness of the third magnetic pattern is smaller than a thickness of the second magnetic pattern.

18. A magnetic memory device, comprising:
    an interconnection structure on a substrate, the interconnection structure comprising interconnection lines spaced apart from each other in a first direction perpendicular to a top surface of the substrate, and comprising contacts between the interconnection lines;
    a lower contact plug on the interconnection structure and connected to a topmost one of the interconnection lines;
    a magnetic tunnel junction pattern on the lower contact plug;
    a bottom electrode between the lower contact plug and the magnetic tunnel junction pattern;

a top electrode on the magnetic tunnel junction pattern;
an in-plane magnetic structure between the magnetic tunnel junction pattern and the top electrode; and
a spacer between the magnetic tunnel junction pattern and the in-plane magnetic structure,
wherein the in-plane magnetic structure comprises:
   a first magnetic pattern;
   a second magnetic pattern on the first magnetic pattern; and
   a non-magnetic pattern between the first and second magnetic patterns,
wherein the first and second magnetic patterns comprise at least one of nickel, iron, or cobalt,
wherein a thickness of each of the first and second magnetic patterns is greater than or equal to 0.5 nm and is smaller than 10 nm,
wherein a thickness of the first magnetic pattern is smaller than a thickness of the second magnetic pattern, and
wherein a magnetocrystalline anisotropy energy of each of the first and second magnetic patterns is greater than 0 erg/cm$^3$ and is smaller than $1\times10^7$ erg/cm$^3$.

19. The device of claim 18, wherein the spacer comprises magnesium oxide, tantalum oxide, or tantalum, and wherein the non-magnetic pattern comprises at least one of iridium (Ir), chromium (Cr), or ruthenium (Ru).

20. The device of claim 18, wherein an exchange coupling constant (Jex) between the first and second magnetic patterns ranges from −0.1 erg/cm$^2$ to −2 erg/cm$^2$.

* * * * *